(12) United States Patent
Lin et al.

(10) Patent No.: US 11,024,594 B2
(45) Date of Patent: Jun. 1, 2021

(54) SUBSTRATE AND PACKAGE STRUCTURE

(71) Applicant: Taiwan Semiconductor Manufacturing Company, Ltd., Hsinchu (TW)

(72) Inventors: Wei-Hung Lin, Xinfeng Township (TW); Hsiu-Jen Lin, Zhubei (TW); Ming-Da Cheng, Jhubei (TW); Yu-Min Liang, Zhongli (TW); Chen-Shien Chen, Zhubei (TW); Chung-Shi Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/199,507

(22) Filed: Nov. 26, 2018

(65) Prior Publication Data
US 2019/0096839 A1 Mar. 28, 2019

Related U.S. Application Data

(63) Continuation of application No. 15/242,722, filed on Aug. 22, 2016, now Pat. No. 10,141,281, which is a continuation of application No. 14/190,360, filed on Feb. 26, 2014, now Pat. No. 9,425,157.

(51) Int. Cl.
*H01L 23/488* (2006.01)
*H01L 23/00* (2006.01)

(52) U.S. Cl.
CPC .............. *H01L 24/17* (2013.01); *H01L 24/14* (2013.01); *H01L 24/16* (2013.01); *H01L 24/13* (2013.01); *H01L 2224/0401* (2013.01); *H01L 2224/131* (2013.01); *H01L 2224/13005* (2013.01); *H01L 2224/13082* (2013.01); *H01L 2224/1403* (2013.01); *H01L 2224/16013* (2013.01); *H01L 2224/16104* (2013.01); *H01L 2224/16238* (2013.01); *H01L 2224/1701* (2013.01); *H01L 2224/1703* (2013.01); *H01L 2224/17104* (2013.01)

(58) Field of Classification Search
CPC ... H01L 24/10–17; H01L 24/25; H01L 24/82; H01L 24/24; H01L 2224/3225; H01L 2224/73267; H01L 2224/8203; H01L 2224/04105; H01L 2224/24116; H01L 2224/92244
See application file for complete search history.

(56) References Cited

U.S. PATENT DOCUMENTS

| | | | |
|---|---|---|---|
| 5,497,258 A | 3/1996 | Ju et al. | |
| 8,344,505 B2 * | 1/2013 | Mclellan | H01L 24/94 257/737 |
| 9,425,157 B2 * | 8/2016 | Lin | H01L 24/14 |
| 9,430,605 B2 * | 8/2016 | Lai | G06F 30/392 |
| 2006/0214297 A1 | 9/2006 | Moriyama | |
| 2013/0228916 A1 | 9/2013 | Mawatari | |
| 2013/0264105 A1 * | 10/2013 | Kitamura | H05K 1/0296 174/260 |

(Continued)

*Primary Examiner* — Hoa B Trinh
(74) *Attorney, Agent, or Firm* — Slater Matsil, LLP

(57) ABSTRACT

According to an exemplary embodiment, a substrate having a first area and a second area is provided. The substrate includes a plurality of pads. Each of the pads has a pad size. The pad size in the first area is larger than the pad size in the second area.

17 Claims, 3 Drawing Sheets

(56) References Cited

U.S. PATENT DOCUMENTS

2014/0057392 A1* 2/2014 Nah .................. H01L 24/81
 438/108
2015/0031173 A1 1/2015 Nah et al.

* cited by examiner

SUBSTRATE AND PACKAGE STRUCTURE

PRIORITY CLAIM AND CROSS-REFERENCE

This application is a continuation of U.S. application Ser. No. 15/242,722, filed Aug. 22, 2016, which is a continuation of U.S. patent application Ser. No. 14/190,360, filed Feb. 26, 2014, now U.S. Pat. No. 9,425,157, issued Aug. 23, 2016, which applications are hereby incorporated herein by reference.

BACKGROUND

For bump-on-trace technology, yield of a flip chip package may be influenced by the size or the shape of bumps and pads in the package. There is a need to carefully design the size and the shape.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
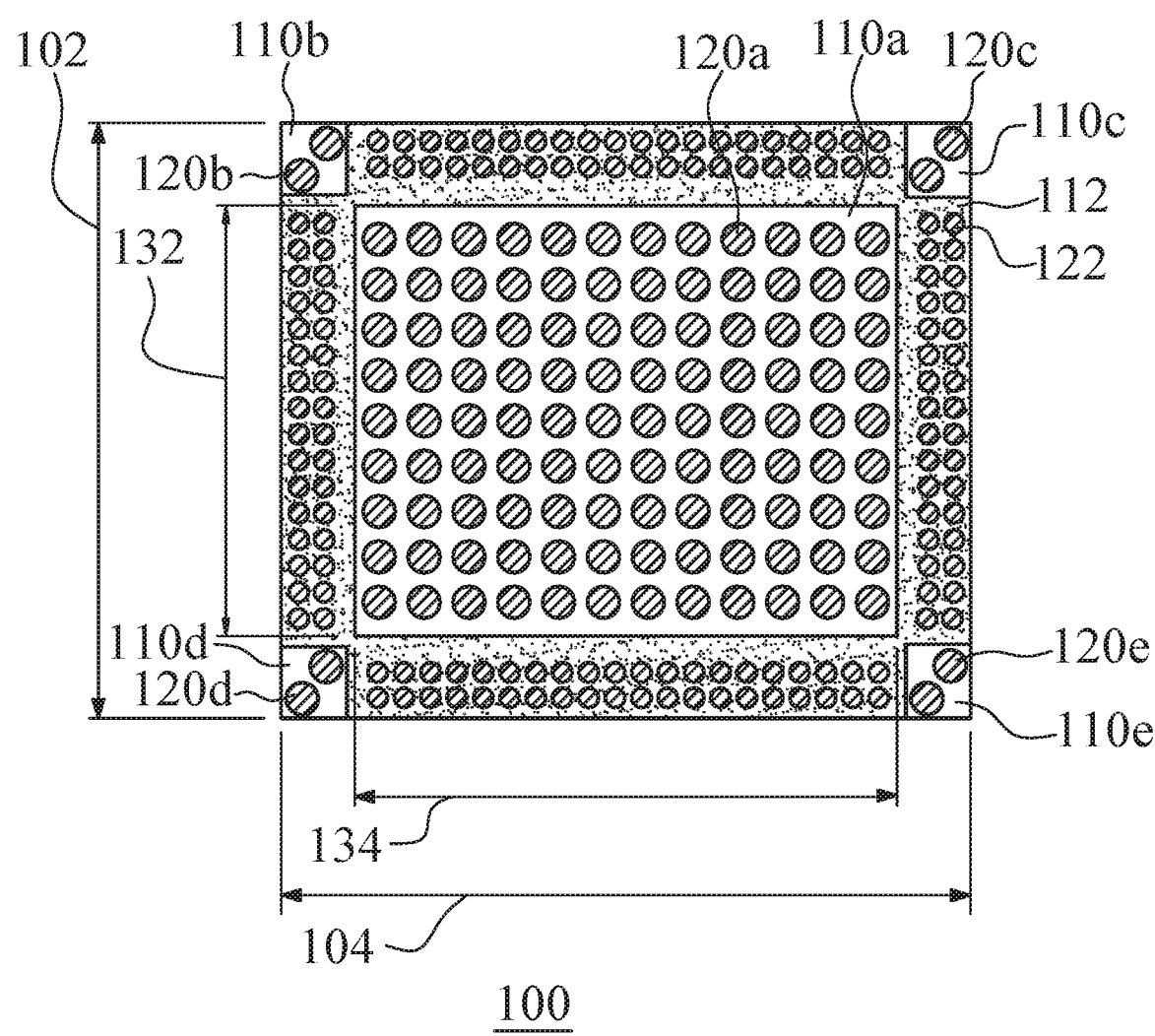
FIG. 1 is a top view illustrating an exemplar substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The disclosure describes a package structure that has a larger ratio of substrate pad sizes to chip bump sizes in (1) a core area, (2) a corner area and (3) an area with loose traces/lines, and has a smaller ratio in other areas. The larger ratio may refer to about 0.75-1.25, and the smaller may refer to about 0.5. The structure improves a bridging window between the substrate pad and the chip bump, and provides better control for reducing bump shifting to enhance the joint yield in bump-on-trace technology.

The disclosure describes a substrate that has a larger pad size in (1) a core area, (2) a corner area and (3) an area with loose traces/lines, and has a smaller pad size in other areas. The substrate improves a bridging window between the substrate pad and the chip bump, and provides better control for reducing bump shifting to enhance the joint yield in bump-on-trace technology.

FIG. 1 is a top view illustrating an exemplar substrate in accordance with some embodiments. As shown in FIG. 1, a substrate 100 has first areas 110a-110e and a second area 112. The substrate 100 includes pads 120a-120e and pad 122. The sizes of the pads 120a-120e in the first areas 110a-110e are larger than the size of the pad 122 in the second area 112. The first area 110a is a core area of the substrate 100. The first areas 110b-110e are corner areas of the substrate 100. Additionally, the first area may further include an area having loose traces (not shown). The second area 112 may include other areas in the substrate 100 except the first area 110a-110e.

The center of the core area 110a is aligned to the center of the substrate 100, the width 134 of the core area 110a is about 80% of the width 104 of the substrate 100, and the length 132 of the core area 110a is about 80% of the length 102 of the substrate 100.

The substrate 100 may increase a bridging window between the substrate pad 120a-120e and the chip bump (not shown), and provide better control for reducing bump shifting to enhance the joint yield in bump-on-trace technology.

Figure 2:
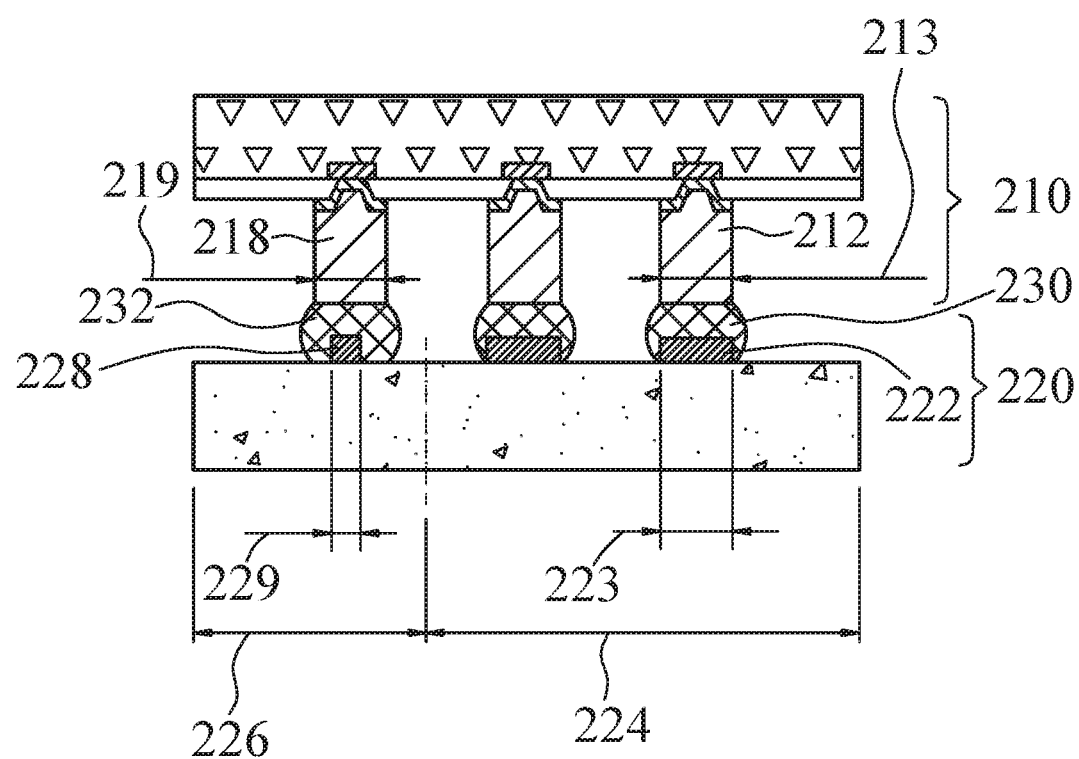
FIG. 2 is a sectional view illustrating a portion of an exemplar package structure in accordance with some embodiments.

FIG. 2 is a sectional view illustrating a portion of an exemplar package structure in accordance with some embodiments. As shown in FIG. 2, the package structure 200 includes a chip 210, a substrate 220, and solders 230, 232. The chip 210 includes bumps 212, 218. Each of the bumps 212, 218 respectively have a bump size 213, 219. The substrate 220 includes pads 222, 228. Each of the pads 222, 228 respectively has a pad size 223, 229. The solder 230 electrically connects the bump 212 to the substrate pad 222, and the solder 232 electrically connects the bump 218 to the substrate pad 228.

The substrate 220 has a first area 224 and a second area 226. The ratio of the pad size 223 to the bump size 213 in the first area 224 is larger than the ratio of the pad size 229 to the bump size 219 in the second area 226. To be more specific, the bump sizes 213, 219 may be identical, and the pad size 223 in the first area 224 is larger than the pad size 229 in the second area 226.

The ratio of the pad size 223 to the bump size 213 in the first area 224 may be about 0.75 to about 1.25. The ratio of the pad size 229 to the bump size 219 in the second area 226 may be about 0.5.

Referring to FIG. 1 and FIG. 2, the first area 224 may correspond to the core area 110a of the substrate 100, the corner area 110b-110e of the substrate 100, or an area having loose traces. The second area 226 may correspond to the edge area 112 and other areas in the substrate 100 except the first area. Additionally, the bump sizes 213, 219 may be smaller than 100 micrometer.

The package structure 200 may increase a bridging window between the substrate pad 222 and the chip bump 212, and provide better control for reducing bump shifting to enhance the joint yield in bump-on-trace technology.

Figure 3:
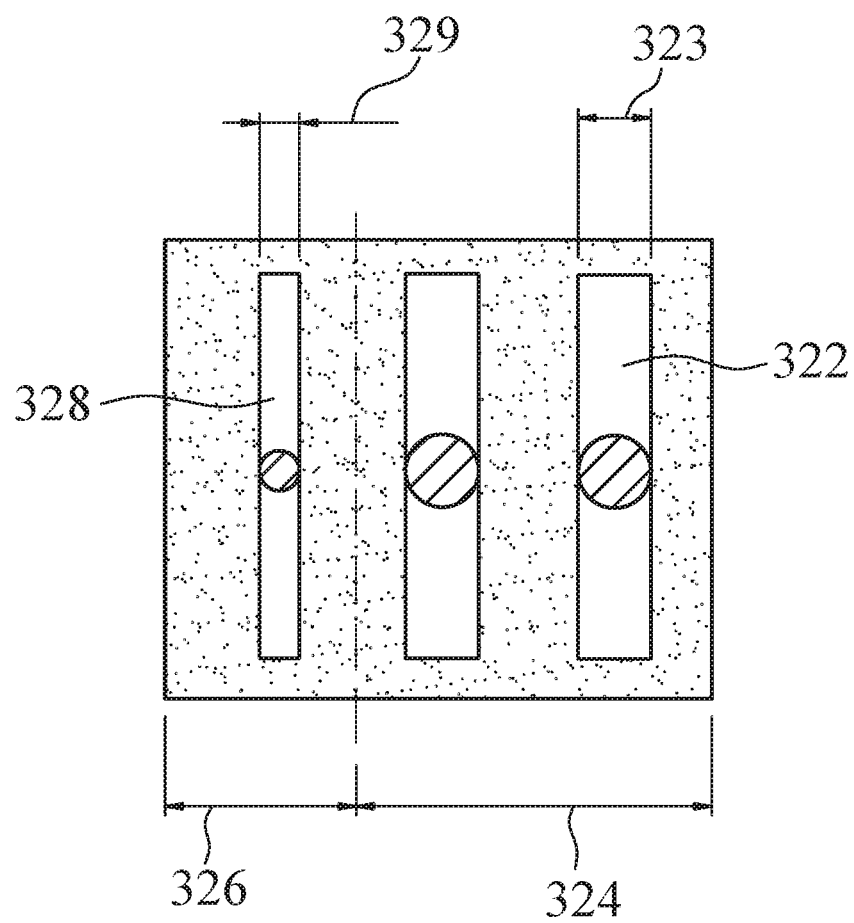
FIG. 3 is a top view illustrating a portion of an exemplar substrate in accordance with some embodiments.

FIG. 3 is a top view illustrating a portion of an exemplar substrate in accordance with some embodiments. As shown in FIG. 3, a substrate 300 has a first area 324 and a second area 326. The substrate 300 includes traces 322, 328. The width 322 of the trace 323 in the first area 324 is larger than the width 329 of the trace 328 in the second area 326.

Referring to FIG. 1 and FIG. 3, the first area 324 may correspond to the core area 110a of the substrate 100, the corner area 110b-110e of the substrate 100, or an area having loose traces. The second area 326 may correspond to other areas in the substrate 100 except the first area. Additionally, the trace widths 323, 329 are smaller than 100 micrometer.

The substrate 300 may increase a bridging window between the trace 322 and the chip bump, and provide better control for reducing bump shifting to enhance the joint yield in bump-on-trace technology.

In an embodiment, a device includes: a substrate including a first pad and a second pad, the first pad being disposed in a first region of the substrate, the second pad being disposed in a second region of the substrate, the first region being in an inner region of the substrate, the second region extending from the first region to a first edge of the substrate, the first pad and the second pad having a same first height, a first width of the first pad being greater than a second width of the second pad; a chip including a first bump and a second bump, the first bump and the second bump having a same third width; a first connector coupling the first bump to the first pad; and a second connector coupling the second bump to the second pad.

In some embodiments of the device, the substrate further includes a third pad, the third pad being disposed in a third region of the substrate, the third region extending from the second region to a second edge of the substrate, the third pad having the first width, and where the chip further includes a third bump, the third bump having the third width. In some embodiments, the device further includes: a third connector coupling the third bump to the third pad. In some embodiments of the device, the first connector and the second connector are solder connectors. In some embodiments of the device, the substrate further includes a plurality of first pads in the first region and a plurality of second pads in the second region, each of the first pads having the first width, each of the second pads having the second width, where a width of the first region is about 80% of a width of the substrate, and a width of the second region is about 80% of the width of the substrate. In some embodiments of the device, a ratio of the first width to the third width is from about 0.75 to about 1.25, and where a ratio of the second width to the third width is about 0.5. In some embodiments of the device, the first width is less than 100 micrometers.

In an embodiment, a device includes: a chip including a first bump and a second bump, the first bump and the second bump having a same first width; a substrate including a first conductive feature and a second conductive feature, the first conductive feature being disposed in a first region of the substrate, the second conductive feature being disposed in a second region of the substrate, the first conductive feature having a second width and a first height, the second conductive feature having a third width and the first height; a first connector coupling the first bump to the first conductive feature; and a second connector coupling the second bump to the second conductive feature, where a ratio of the second width to the first width is different than a ratio of the third width to the first width.

In some embodiments of the device, the first conductive feature and the second conductive feature are traces. In some embodiments of the device, the first conductive feature and the second conductive feature are pads. In some embodiments of the device, the first connector and the second connector are solder connectors. In some embodiments of the device, the first region of the substrate is a core area of the substrate. In some embodiments of the device, the first region of the substrate is a corner area of the substrate. In some embodiments of the device, the second region of the substrate is an edge area of the substrate. In some embodiments of the device, the substrate further includes a plurality of first conductive features in the first region and a plurality of second conductive features in the second region, each of the first conductive features having the second width, each of the second conductive features having the third width, where a width of the first region is about 80% of a width of the substrate, and a width of the second region is about 80% of the width of the substrate. In some embodiments of the device, the ratio of the second width to the first width is from about 0.75 to about 1.25, and the ratio of the third width to the first width is about 0.5. In some embodiments of the device, the first width is less than 100 micrometers.

In an embodiment, a method includes: providing a substrate including a first pad and a second pad, the first pad being disposed in a first region of the substrate, the second pad being disposed in a second region of the substrate, the first region being in an inner region of the substrate, the second region extending from the first region to a first edge of the substrate, the first pad and the second pad having a same first height, a first width of the first pad being greater than a second width of the second pad; providing a chip including a first bump and a second bump, the first bump and the second bump having a same third width; coupling the first bump to the first pad with a first connector; and coupling the second bump to the second pad with a second connector.

In some embodiments of the method, the substrate further includes a third pad, the third pad being disposed in a third region of the substrate, the third region extending from the second region to a second edge of the substrate, the third pad having the first width, and where the chip further includes a third bump, the third bump having the third width. In some embodiments, the method further includes: coupling the third bump to the third pad with a third connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate comprising a plurality of first pads, a plurality of second pads, and a plurality of third pads, the first pads being disposed in a first region of the substrate, the second pads being disposed in a second region of the substrate, the third pads being disposed in a third region of the substrate, the second region surrounding the first region such that the second region extends around a perimeter of the first region in a top-down view, the second region extending from the first region to edges of the substrate, the third region disposed at a corner of the substrate, the first pads and the second pads having a same first height, a first width of the first pads being greater than a second width of the second pads, the third pads having the first width;

a chip comprising a plurality of first bumps, a plurality of second bumps, and a plurality of third bumps, the first bumps, the second bumps, and the third bumps having a same third width;

a plurality of first connectors coupling the first bumps to the first pads; and a plurality of second connectors coupling the second bumps to the second pads.

2. The device of claim 1 further comprising:

a plurality of third connectors coupling the third bumps to the third pads.

3. The device of claim 1, wherein the first connectors and the second connectors are solder connectors.

4. The device of claim 1, wherein a width of the first region is about 80% of a width of the substrate, and a length of the first region is about 80% of the length of the substrate.

5. The device of claim 1, wherein a ratio of the first width to the third width is from about 0.75 to about 1.25, and wherein a ratio of the second width to the third width is about 0.5.

6. The device of claim 1, wherein the first width is less than 100 micrometers.

7. A device comprising:

a chip comprising a first bump, a second bump, and a third bump, the first bump, the second bump, and the third bump each having a same first width;

a substrate comprising a first conductive feature, a second conductive feature, and a third conductive feature, the first conductive feature being disposed between the second conductive feature and the third conductive feature, the first conductive feature having a second width and a first height, the second conductive feature and the third conductive feature each having a third width and the first height;

a first connector coupling the first bump to the first conductive feature;

a second connector coupling the second bump to the second conductive feature; and a third connector coupling the third bump to the third conductive feature, wherein a ratio of the second width to the first width is greater than a ratio of the third width to the first width, wherein the first conductive feature is part of a plurality of first conductive features in a first region of the substrate, each of the first conductive features having the second width, a width of the first region being about 80% of a width of the substrate, a length of the first region being about 80% of the length of the substrate, and wherein the second conductive feature and the third conductive feature are part of a plurality of second conductive features in a second region of the substrate, each of the second conductive features having the third width, the second region surrounding the first region such that the second region extends around a perimeter of the first region in a top-down view.

8. The device of claim 7, wherein the first conductive feature, the second conductive feature, and the third conductive feature are traces.

9. The device of claim 7, wherein the first conductive feature, the second conductive feature, and the third conductive feature are pads.

10. The device of claim 7, wherein the first connector, the second connector, and the third connector are solder connectors.

11. The device of claim 7, wherein the first conductive feature is disposed in a core area of the substrate.

12. The device of claim 7, wherein the first conductive feature is disposed in a corner area of the substrate.

13. The device of claim 7, wherein the second conductive feature and the third conductive feature are disposed in an edge area of the substrate.

14. The device of claim 7, wherein the ratio of the second width to the first width is from about 0.75 to about 1.25, and the ratio of the third width to the first width is about 0.5.

15. The device of claim 7, wherein the first width is less than wo micrometers.

16. A method comprising:

providing a substrate comprising a plurality of first pads, a plurality of second pads, and a plurality of third pads, the first pads being disposed in a first region of the substrate, the second pads being disposed in a second region of the substrate, the third pads being disposed in a third region of the substrate, the second region surrounding the first region such that the second region extends around a perimeter of the first region in a top-down view, the second region extending from the first region to edges of the substrate, the third region disposed at a corner of the substrate, the first pads and the second pads having a same first height, a first width of the first pads being greater than a second width of the second pads, the third pads having the first width;

providing a chip comprising a plurality of first bumps, a plurality of second bumps, and a plurality of third bumps, the first bumps, the second bumps, and the third bumps having a same third width;

coupling the first bumps to the first pads with a plurality of first connectors; and coupling the second bumps to the second pads with a plurality of second connectors.

17. The method of claim 16 further comprising:

coupling the third bumps to the third pads with a plurality of third connectors.

\* \* \* \* \*

UNITED STATES PATENT AND TRADEMARK OFFICE
CERTIFICATE OF CORRECTION

Page 1 of 1

PATENT NO. : 11,024,594 B2
APPLICATION NO. : 16/199507
DATED : June 1, 2021
INVENTOR(S) : Wei-Hung Lin et al.

It is certified that error appears in the above-identified patent and that said Letters Patent is hereby corrected as shown below:

In the Claims

In Claim 15, Column 6; Line 26 delete "wo" insert --100--

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*